United States Patent
Purkl et al.

(10) Patent No.: US 9,064,982 B2
(45) Date of Patent: Jun. 23, 2015

(54) THIN-FILM ENCAPSULATED INFRARED SENSOR

(71) Applicant: Robert Bosch GmbH, Stuttgart (DE)

(72) Inventors: Fabian Purkl, Palo Alto, CA (US); Gary Yama, Mountain View, CA (US); Ando Feyh, Palo Alto, CA (US); Andrew Graham, Redwood City, CA (US); Ashwin Samarao, Mountain View, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/109,917

(22) Filed: Dec. 17, 2013

(65) Prior Publication Data
US 2014/0248735 A1    Sep. 4, 2014

Related U.S. Application Data

(60) Provisional application No. 61/740,737, filed on Dec. 21, 2012.

(51) Int. Cl.
*H01L 21/00* (2006.01)
*H01L 31/0203* (2014.01)
*G01J 5/04* (2006.01)
*G01J 5/20* (2006.01)
*H01L 31/09* (2006.01)
*H01L 31/18* (2006.01)

(52) U.S. Cl.
CPC ............ *H01L 31/0203* (2013.01); *G01J 5/045* (2013.01); *G01J 5/20* (2013.01); *H01L 31/09* (2013.01); *H01L 31/18* (2013.01)

(58) Field of Classification Search
USPC .......................................................... 438/64
See application file for complete search history.

(56) References Cited

U.S. PATENT DOCUMENTS

| | | | |
|---|---|---|---|
| 2006/0131501 A1* | 6/2006 | Ikushima et al. | 250/338.1 |
| 2011/0156188 A1* | 6/2011 | Tu et al. | 257/432 |

FOREIGN PATENT DOCUMENTS

| | | |
|---|---|---|
| DE | 10058864 A1 | 6/2002 |
| EP | 1243903 A2 | 9/2002 |
| EP | 2447688 A1 | 5/2012 |

OTHER PUBLICATIONS

International Search Report and Written Opinion corresponding to PCT Application No. PCT/US2013/077052, mailed Mar. 6, 2014 (9 pages).

* cited by examiner

*Primary Examiner* — Asok K Sarkar
(74) *Attorney, Agent, or Firm* — Maginot Moore & Beck LLP

(57) ABSTRACT

A method of fabricating a bolometer infrared sensor includes depositing a first sacrificial layer on a surface of a substrate over a sensor region, and forming an absorber structure for the infrared sensor on top of the first sacrificial layer. A second sacrificial layer is deposited on top of the absorber structure. An encapsulating thin film is then deposited on top of the second sacrificial layer. Vent holes are formed in the encapsulating thin film. The first and the second sacrificial layers are removed below the encapsulating thin film to release the absorber structure and form a cavity above the sensing region that extends down to the substrate in which the absorber structure is located via the vent holes. The vent holes are then closed in a vacuum environment to seal the absorber structure within the cavity.

16 Claims, 4 Drawing Sheets

THIN-FILM ENCAPSULATED INFRARED SENSOR

CROSS-REFERENCE TO RELATED APPLICATIONS

This application claims priority to U.S. Provisional Application Ser. No. 61/740,737 entitled "THIN-FILM ENCAPSULATED INFRARED SENSOR" by Purkl et al., filed Dec. 21, 2012, the disclosure of which is hereby incorporated herein by reference in its entirety.

TECHNICAL FIELD

This disclosure relates generally to infrared radiation sensors, and in particular to bolometer infrared radiation sensors.

BACKGROUND

In general, infrared radiation (IR) sensors are used in a variety of applications to detect infrared radiation and provide an electrical output that is a measure of the incident infrared radiation. One type of infrared sensor is a bolometer. A bolometer includes a sensor structure configured to absorb infrared radiation and a transducer element in thermal contact with the sensor structure. The transducer element has an electrical resistance that varies with temperature. Infrared radiation incident upon the bolometer will be absorbed by the absorber element of the bolometer and the heat generated by the absorbed radiation will be transferred to the transducer element. As the transducer element heats in response to the absorbed radiation, the electrical resistance of the transducer element will change in a predetermined manner. By detecting changes in the electrical resistance, a measure of the incident infrared radiation can be obtained.

The sensitivity of a bolometer depends at least partially on how well the absorber and transducer elements of the sensor is thermally isolated from surrounding structures. The sensitivity generally increases with better thermal isolation. The sensor structure is usually suspended above the surface of the substrate to minimize heat loss through thermal contact with the substrate. To prevent heat losses through convection, vacuum encapsulation of the sensor structure is often required. In previously known fabrication processes, vacuum encapsulation of the sensor structure was accomplished on chip level using, for example, metal can packages. Chip-level vacuum encapsulation, however, is a costly packaging process, which is difficult to scale up for very large volume fabrication.

Recent developments have enabled sensor structures to be vacuum encapsulated on a wafer level with wafer bonding. In wafer bonding, a cap wafer is bonded onto the sensor wafer over the sensor structure. However, wafer bonding requires the use of a bond frame in the cap wafer which can significantly increase the size of the device. In addition, for wafer bonding, the thickness of the encapsulating structure has strict lower limits due to mechanical stiffness requirements for handling of the cap wafer. As a result, the encapsulating structure is thicker than would otherwise be required which results in increased absorption losses of the infrared radiation traveling through the cap.

DRAWINGS

DESCRIPTION

Figure 1:
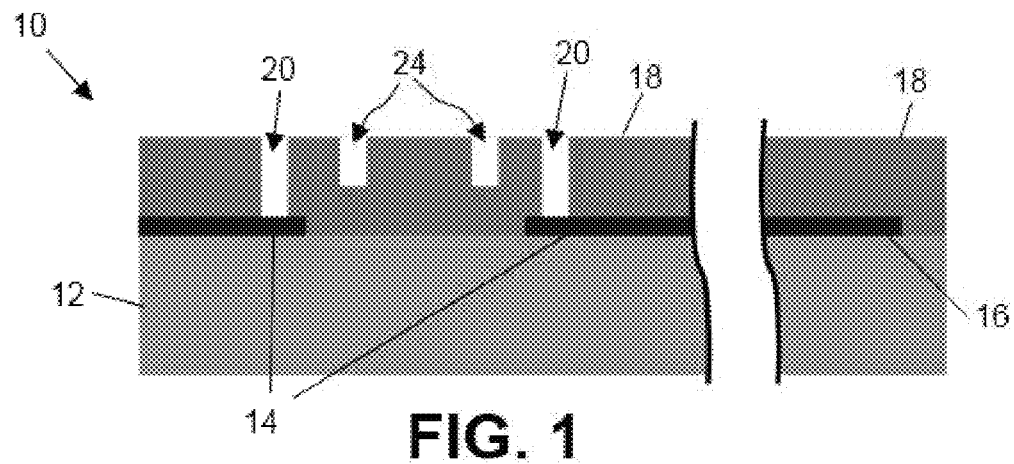
FIGS. 1-5 depict a series of cross section images that schematically show the fabrication process for a bolometer sensor including vacuum encapsulation in accordance with the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

In one embodiment, a method of fabricating a bolometer infrared sensor is provided. The method includes depositing a first sacrificial layer on a surface of a substrate over a sensor region, and forming an absorber structure for the infrared sensor on top of the first sacrificial layer. A second sacrificial layer is deposited on top of the absorber structure. An encapsulating thin film is then deposited on top of the second sacrificial layer. Vent holes are formed in the encapsulating thin film. The first and the second sacrificial layers are removed below the encapsulating thin film to release the absorber structure and form a cavity above the sensing region that extends down to the substrate in which the absorber structure is located via the vent holes. The vent holes are then closed in a vacuum environment to seal the absorber structure within the cavity.

The method enables infrared sensors to be encapsulated in a vacuum on wafer level without the need to bond a cap wafer onto a substrate. By eliminating the need for a cap wafer, the process of encapsulating infrared sensors is simplified and costs can be significantly reduced in comparison to previously known encapsulation methods. In addition, the footprint of the sensor can be decreased because there is no need for a bond frame which is typically required for the wafer bonding approach. Furthermore, the encapsulating thin film in the method described here can be thinner. As a result, the absorption losses of the infrared radiation traveling through the cap are decreased, which lead to a higher sensitivity of the sensor.

A process for fabricating an infrared radiation sensor 10 that includes vacuum encapsulation on the wafer level without requiring costly packaging or wafer bonding will now be described with reference to FIGS. 1-5. FIG. 1 depicts a substrate 12 for implementing an infrared radiation sensor 10 during the initial stages of the fabrication process. In the embodiment of FIG. 1, the substrate 12 comprises an oxidized silicon wafer. Conductive traces 14 are formed on the wafer for connecting the sensor to bond pads 16 located outside the encapsulated area. The traces 14 may be formed in any suitable manner, such as by the deposition of a conductive film or implant doping of the silicon substrate. The bond pads 16 are used to connect the sensor to external circuitry (not shown) for processing sensor output.

A first sacrificial layer 18 is deposited on the substrate over the traces 14. The first sacrificial layer 18 may be formed of any suitable sacrificial material and deposited in any suitable manner. In one embodiment, the first sacrificial layer 18 comprises a silicon dioxide (SiO2) deposited onto the substrate using a chemical vapor deposition (CVD) process. Alternatively, a thermal oxidation process could be used. Examples of other materials that can be used for the first sacrificial layer include germanium (Ge), silicon-germanium (SiGe), silicon (Si), polymer, and Unity®.

The first sacrificial layer 18 is etched to form anchor holes 20 that extend through the first sacrificial layer 18 to the traces 14. The anchor holes 20 provide access for electrically connecting the absorber 22 (FIG. 2) of the sensor 10 to the traces 14. The anchor holes 20 also define structural features that are used to suspend the absorber 22 above the substrate 12 to help thermally isolate the absorber from the substrate 12. Additional features may be etched into the first sacrificial layer to define the shape of the absorber 22. For example, trenches 24 are etched into the first sacrificial layer 18 for adding mechanical stability to the sensor structure 24.

The type of etchant or etch process used to form the anchor holes 20 and trenches depends primarily on the type of sacrificial material. For silicon dioxide sacrificial materials, a vapor-HF (hydrofluoric acid) release etch may be used. For silicon, germanium, and silicon-germanium sacrificial materials, xenon difluoride (XeF2) or chlorine trifluoride (ClF3) may be used. Polymer sacrificial materials may be etched or removed using ClF3 or O2 plasma. Unity® can be removed through thermal decomposition.

Figure 2:
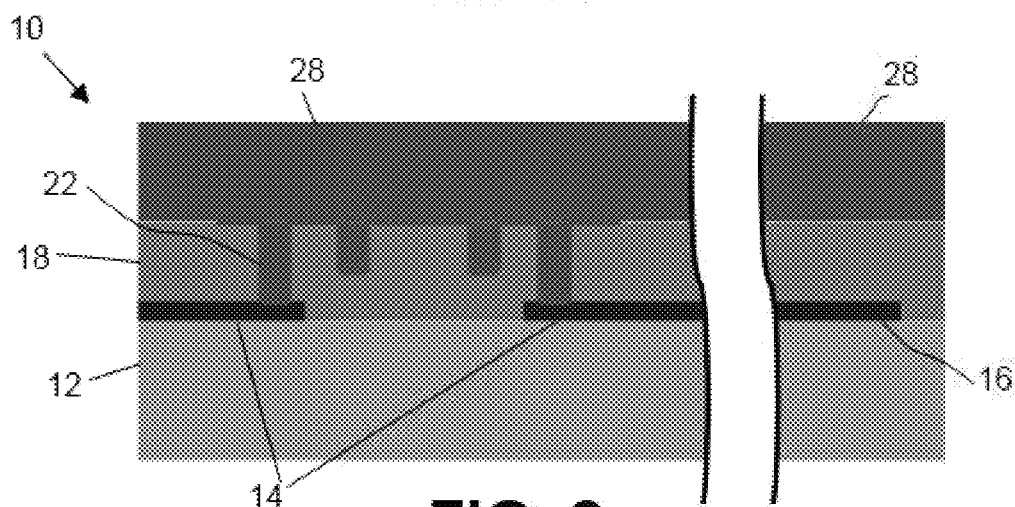
Figure 3:
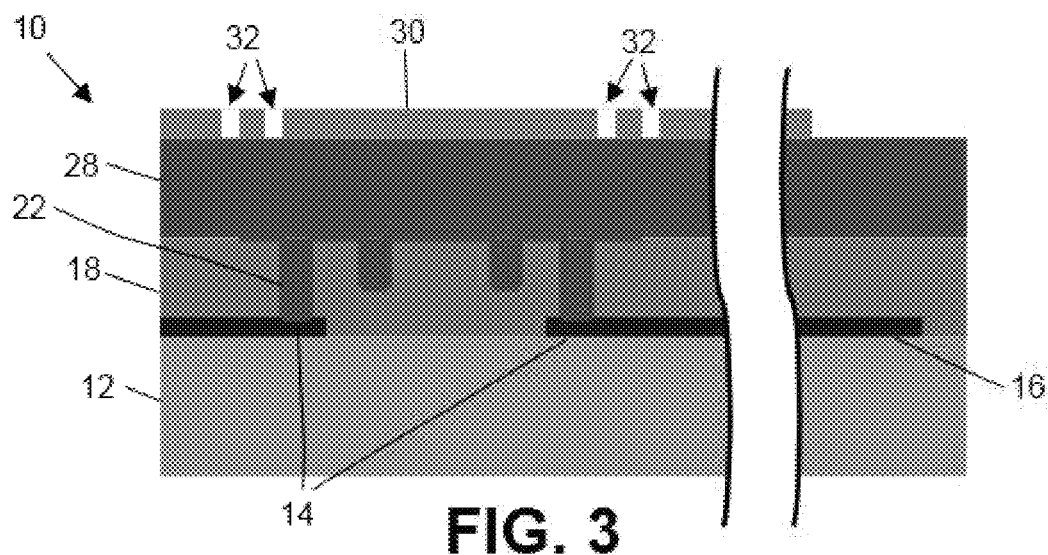
Figure 4:
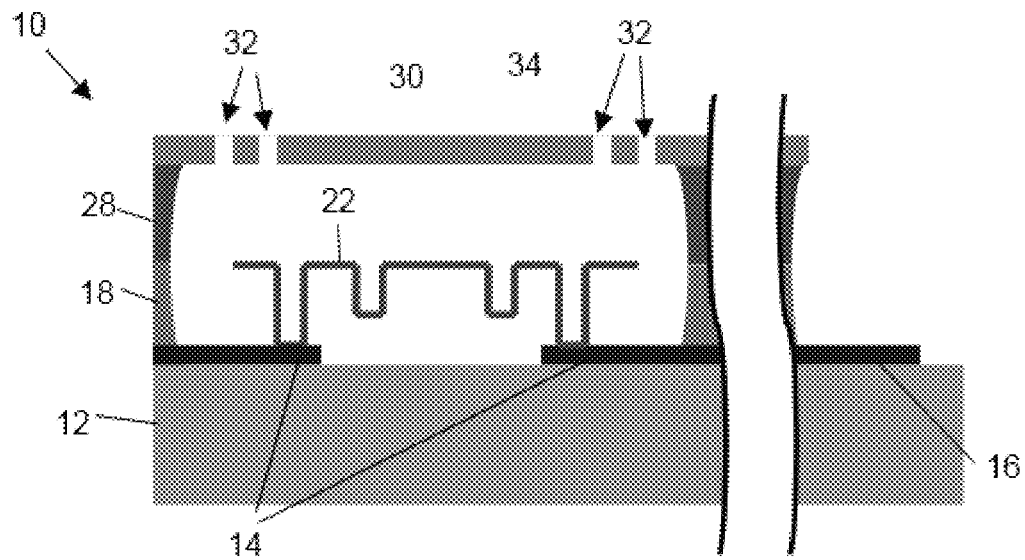
Figure 5:
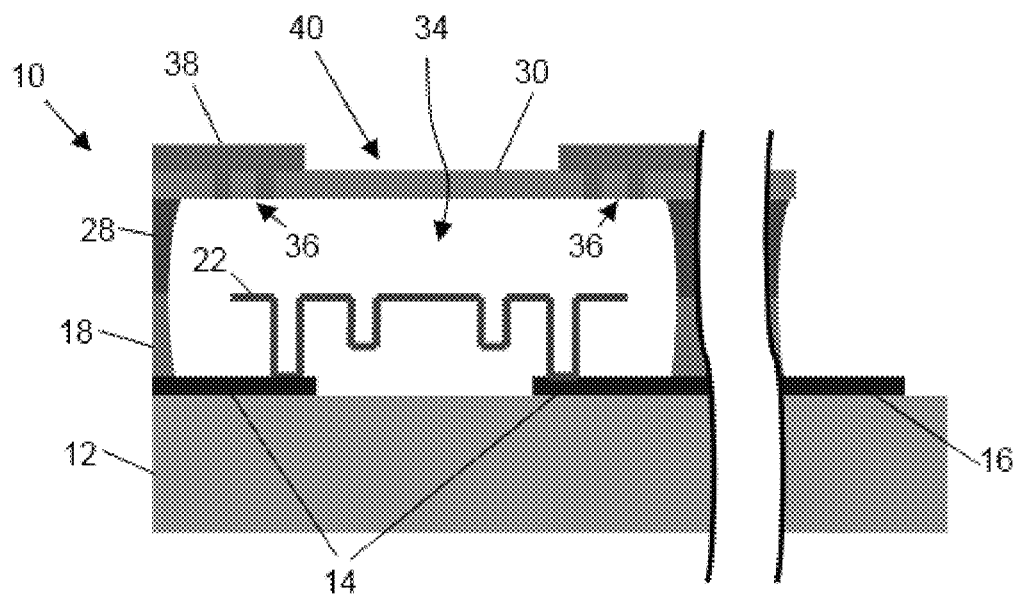

Referring to FIG. 2, the material that forms the sensor structure 24 for the sensor 10 is deposited onto the first sacrificial layer 18 such that it conformally follows the contours of the anchor holes 20 and trenches 24. The portions of the absorber that are formed in the anchor holes 20 are electrically connected to the traces 14 and also form support structures for suspending the sensor structure 24 above the substrate to form a gap 26 between the sensor structure 24 and the substrate 12 as depicted in FIGS. 4 and 5. The gap 26 helps to thermally isolate the sensor structure 24 from the substrate 12. Although not shown in FIGS. 1-5, a mirror or reflector structure may be provided on the substrate 12 below the sensor structure 24 for reflecting infrared radiation that reaches the substrate 12 back toward the sensor structure 24.

The sensor structure 24, in addition to absorbing energy from incident photons, is selected to provide a good noise-equivalent temperature difference (NETD). In order for the sensor structure 24 to have a good NETD, the material selected to form the absorber 42 should exhibit a high temperature coefficient of resistance while exhibiting low excess noise (1/f noise). Semiconductor materials such as vanadium oxide are common in micromachined bolometers due to their high temperature coefficient of resistance. Other materials include Si (poly/amorphous), SiGe, Ge, Pt, TiN, Ti, and combinations of the foregoing. While metals have a lower temperature coefficient of resistance than some semiconductor materials, such as vanadium oxide, metals typically have much lower excess noise than many semiconductor materials, thus offering better NETD.

Accordingly, in one embodiment the sensor structure 24 comprises metal. Titanium and Platinum are two metals which exhibit desired characteristics. Titanium, for example, exhibits a bulk resistivity of about $7*10^{-7}$ Ohm. Using a bulk resistivity of $7*10^{-7}$ Ohm, the thickness of the absorber 108 needed to match the impedance of free-space (377 Ohm/square) should be about 1.9 nm. The resistivity of materials formed to a thickness less than about 50 nm, however, can be several times higher than the bulk value. Accordingly, depending on process parameters, the thickness of the sensor structure 24, if made from titanium, is preferably about 10 nm. Impurities can also be introduced into the sensor structure 24 during formation in order to tune the resistivity if needed.

Consequently, the thickness of the sensor structure 24 in this embodiment is about 10 nm and the length of the sensor structure 24 between the support posts (in anchor holes 20) is typically between 15 μm and 70 μm. This configuration provides a ratio between the thickness of the sensor structure 24 and the length of the sensor structure 24 on the order of 1/1000 and the ratio of the thickness of the sensor structure 24 to the gap width of about 1/100.

After the sensor structure 24 is formed on the first sacrificial layer 18, a second sacrificial layer 28 is deposited onto the sensor structure 24 and the first sacrificial layer 20. The second sacrificial layer is used to define the shape and positioning of the encapsulating layer 30 (FIG. 3). The second sacrificial layer 28 may be formed of a different sacrificial material or the same sacrificial material as the first sacrificial layer, and may be deposited in any suitable manner. The thickness of the second sacrificial layer 28 is selected in conjunction with the first sacrificial layer thickness to position the encapsulating layer 30 a suitable distance above the sensor structure 24.

Referring now to FIG. 3, the encapsulating layer 30 is deposited onto the second sacrificial layer 28 as a thin film having a thickness typically in the range of 5-50 μm. In various embodiments, the encapsulating film 30 is formed of a material that is substantially transparent to infrared radiation to allow infrared radiation to reach the sensor structure 24. For example, in one embodiment, the encapsulating layer 30 is transparent to infrared light having a wavelength in the range of 3-6 μm and/or 8-12 μm The encapsulating layer 30 may comprise un-doped or lowly doped silicon, metal, oxides or un-doped or lowly doped germanium. Any suitable deposition process may be used depending on the type of material and the desired thickness. If a getter is needed to achieve the required vacuum level, a getter can be deposited before depositing the encapsulating layer 30. After the encapsulating layer 30 has been formed, vent holes 32 are etched into the encapsulating layer to provide access to the sacrificial materials in the sensing region around the sensor structure 24.

After the vent holes 32 are formed, the sacrificial layers 18, 28 are removed in the sensor region below the encapsulating layer 30 and down to the substrate 12 to form a cavity 34. The sacrificial layers 18, 28 are also removed laterally to an extent such that the entire absorber structure 24 is released from the sacrificial layers 18, 28 as depicted in FIG. 4. The sacrificial layers 18, 28 may be removed using an appropriate etchant or etch process for the type of sacrificial material(s) utilized. For example, in one embodiment, a vapor-based etching process is used in which an etch gas is introduced through the vent holes 32. As can be seen to the right in FIG. 4, the sacrificial layers 18, 28 are also removed to expose the bond pads 16 which may be performed simultaneously with the removal of the sacrificial layers in the sensor region.

Figure 6:
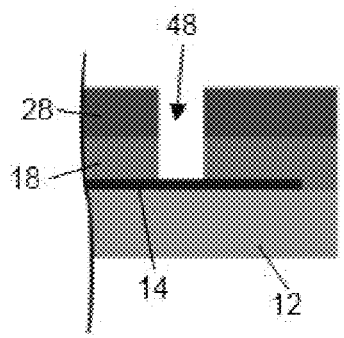
FIGS. 6-8 depict a process of forming an etch stop during the fabrication process of FIGS. 1-5.
Figure 7:
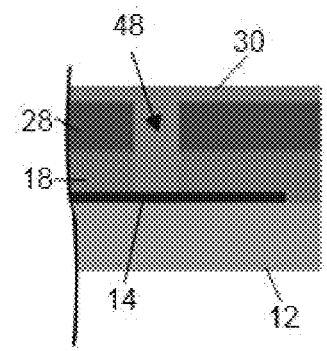
Figure 8:
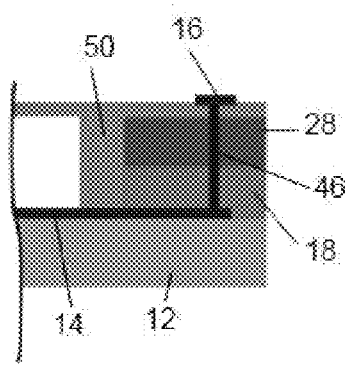

An etch stop for the release etch may be used to define the lateral extent of the sensor region. In one embodiment, an etch stop may be formed by etching a trench through the first and second sacrificial layers 18, 28 and filling the trench during deposition of the encapsulating layer 30. FIGS. 6-8 depict an example of such a process. As depicted in FIG. 6, a trench 48 is etched through the first and second sacrificial layers 18, 28 down to the substrate 12. The encapsulating layer 30 is deposited such that it fills the trench 48 as depicted in FIG. 7. The post 50 formed by the portion of the encapsulating layer 30 that is deposited into the trench 48 forms an etch stop that defines the boundary for removing the sacrificial layers 18, 28 from the sensor region as depicted in FIG. 8. In this manner, over-etching during the release step can be prevented. A trench surrounding the entire sensor structure is one possible implementation.

After the sensor structure 24 has been released and the bond pads 16 have been exposed, a material 36 is deposited with a non-conformal deposition process under high vacuum to fill the vent holes 32 and seal the sensor structure 24 in the cavity 34 as depicted in FIG. 5. The material used to seal the vent holes 32 may comprise, for example, metal or a dielectric. As an alternative to the use of vent holes 32, the encapsulating layer 30 can be deposited with an in-situ porosity (sub-µm pore diameter), allowing a sacrificial layer etch through the pores without etching vent-holes. This allows sealing with conformal deposition processes, such as LPCVD/ALD.

After the encapsulating layer 30 has been sealed, a material 38 which is not transparent to infrared radiation can be deposited on the encapsulating layer 30 and structured to form an aperture 40 over the sensor structure 24. The aperture 40 is configured to limit that amount of infrared radiation that reaches the substrate 12 and other non-sensor structures of the device 10 without substantially altering the amount of radiation that reaches the sensor structure 24. By limiting the amount of infrared radiation that reaches the non-sensitive structures of the device with the aperture, the thermal isolation of the sensor structure 24 is enhanced. In addition, the aperture can fulfill a similar function as in a pin-hole camera, limiting the field of view of a sensor or an array of sensors or focusing infrared light onto an array of sensors for imaging applications. Furthermore, by blocking the infrared light from reaching some of the sensor structures, "blind" sensors can be realized, which can be used for differential measurements to subtract offset signals. As can be seen in FIG. 5, the material 38 that defines the aperture 40 is deposited over the vent holes 32 which strengthens the integrity of the seals over the vent holes and thereby helps maintain the vacuum in the cavity 34 which also enhances the thermal isolation of the sensor structure 24.

As an alternative to the aperture structure 40, a lens structure, such as a Fresnel lens, can be formed on top of the encapsulating layer 30 for directing infrared radiation onto the sensor structure 24 and blocking infrared radiation from reaching other non-sensor structures of the sensor 10. By forming the aperture, or lens, on the encapsulating layer 30, the aperture can be directly aligned with the sensor structure 24, whereas the alignment tolerances of the two wafers during wafer bonding makes this alignment problematic in the wafer bonding approach.

The encapsulation process described above can be used to encapsulate a single infrared sensor structure (as shown above) or an array of infrared sensor structures. Sensors to measure other properties such as a pressure sensor to measure the vacuum level in the cavity or a temperature sensor to measure the substrate temperature can be included in the same process. When encapsulating a plurality of sensor structures or pixels, posts supporting the encapsulating layer can be included, e.g. by patterning the sacrificial layer locally and connecting the cap layer to the substrate. These posts can also be used as etch stops during the sacrificial release etch such as depicted in FIGS. 6-8. On top of the encapsulating thin film, a plurality of optical structures such as apertures or lenses can be incorporated to focus the light onto the sensor structures.

Figure 9:
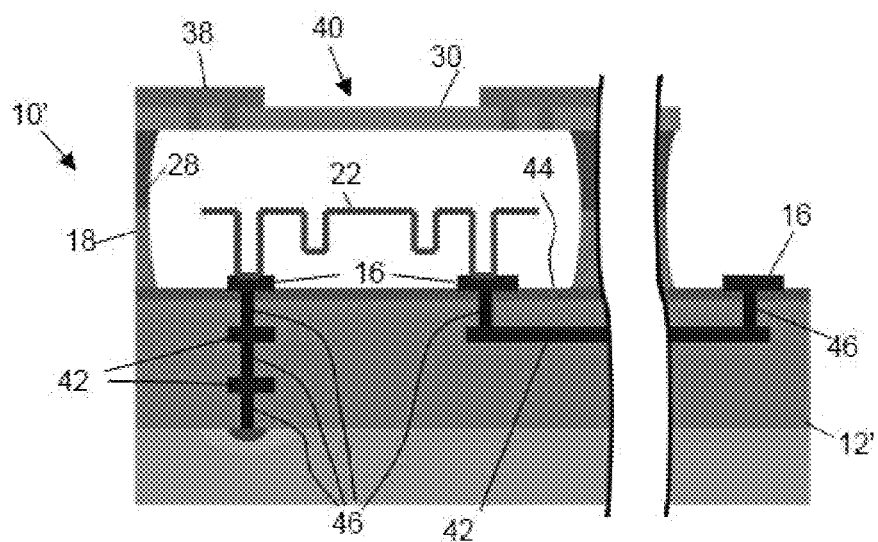
FIG. 9 depicts an alternative embodiment in which the bolometer sensor is implemented on a CMOS substrate.

The encapsulation method described above can also be used to encapsulate an infrared sensor structure on top of a CMOS substrate. FIG. 9 depicts an example of such a sensor 10'. The fabrication process for the sensor of FIG. 9 is similar to the one shown in FIGS. 1-5, but starts with a CMOS substrate 12'. As can be seen in FIG. 9, the readout circuitry can be implemented by metallization layers 42 formed in the interior of the CMOS substrate rather than traces formed on the surface of the substrate as in the embodiment of FIGS. 1-5. The CMOS substrate 12' is coated with an etch stop layer 44 to protect the substrate during the release step.

Figure 10:
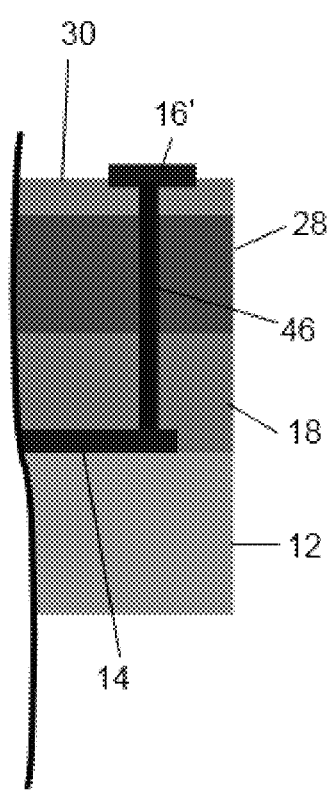
FIGS. 10 and 11 depict an alternative embodiment in which the bond pads for the sensor are formed on top of the encapsulating layer and vias are used to connect the bond pads to readout circuitry on a substrate (FIG. 7) such as depicted in FIGS. 1-5 or to readout circuitry in a CMOS substrate (FIG. 8).
Figure 11:
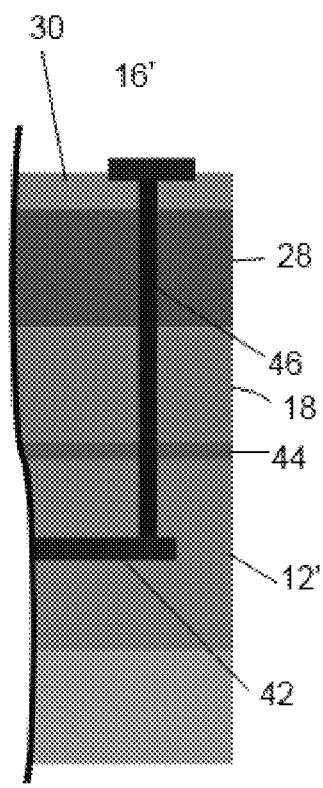

In one alternative embodiment, bond pads 16' may be provided on top of the encapsulating layer 30 as depicted in FIGS. 10 and 11 rather than on the surface of the substrate as in the embodiment of FIGS. 1-5. In this embodiment, the sacrificial layers 18, 28 are not removed outside of the sensor region. Vias 46 are used to connect the bond pads 16' to the readout circuitry from the sensor structure. FIG. 10 depicts the use of such bond pads 16' and vias 46 as part of sensor fabrication process of FIGS. 1-5. A similar configuration is depicted in FIG. 8. FIG. 11 depicts the use of such bond pads 16' and vias 46 for a sensor implemented on a CMOS substrate.

In another alternative embodiment, the sensor may be configured to be irradiated from the backside of the substrate wafer (not shown). In this embodiment, rather than provide mirror on the surface of the substrate for reflecting radiation upwardly toward the sensor structure 24, a mirror or reflector structure can be formed underneath or on top of the encapsulating layer 30 to reflect radiation that reaches the encapsulating layer from the substrate back down toward the sensor structure 24.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of fabricating a bolometer infrared sensor, the method comprising:
    depositing a first sacrificial layer on a surface of a substrate over a sensor region of the substrate;
    forming an absorber structure for the infrared sensor on top of the first sacrificial layer;
    depositing a second sacrificial layer on top of the absorber structure;
    forming a trench through the first sacrificial layer and the second sacrificial layer, the trench surrounding the sensor region;
    depositing an encapsulating layer on top of the second sacrificial layer to form an encapsulating thin film and into the trench to form a perimeter wall around the sensing region;
    forming vent holes in the encapsulating thin film;
    using the vent holes to remove the first and the second sacrificial layers below the encapsulating thin film to release the absorber structure and form a cavity above the sensing region that extends down to the substrate in which the absorber structure is located, the cavity being surrounded by the perimeter wall, the encapsulating thin film being suspended over the cavity and the absorber structure by the perimeter wall; and
    closing the vent holes in a vacuum environment to seal the absorber structure within the cavity.

2. The method of claim 1, wherein the encapsulating thin film has a thickness in a range of approximately 5-50 µm.

3. The method of claim 2, wherein the encapsulating thin film is formed of a material that is substantially transparent to infrared radiation.

4. The method of claim 3, wherein the encapsulating thin film is transparent to infrared wavelengths in a range of 3-6 µm, a range of 8-12 µm, or in a range of 3-6 µm and a range of 8-12 µm.

5. The method of claim 3, wherein the absorber structure is formed of a conductive metal material and has a thickness of approximately 10 nm.

6. The method of claim 3, further comprising:
patterning the first sacrificial layer to define the absorber structure and to define anchors that extend down to the substrate for suspending the absorber structure above the substrate when the absorber structure is released.

7. The method of claim 6, wherein the substrate includes conductive traces for connecting the absorber structure to control circuitry, and
wherein the anchors electrically connect the absorber structure to the conductive traces.

8. The method of claim 7, further comprising:
forming bonding pads that are electrically connected to the conductive traces outside of the sensing region.

9. The method of claim 8, wherein the bonding pads are formed on the substrate and the first and the second sacrificial layers are deposited over the bonding pads, and wherein the first and the second sacrificial layers are removed in regions outside of the sensing region to expose the bonding pads.

10. The method of claim 8, wherein the bonding pads are formed on top of the encapsulating thin film outside of the sensing region, and
the method further comprises forming vias through the first and the second sacrificial layers for electrically connecting the bonding pads to the conductive traces.

11. The method of claim 1, wherein the cavity is formed by introducing an etchant through the vent holes.

12. The method of claim 11, wherein the etchant is an etch gas.

13. The method of claim 1, further comprising:
depositing a material onto the encapsulating thin film under a vacuum to fill the vent holes and seal the absorber structure within the cavity.

14. The method of claim 13, further comprising:
providing a layer of material that is not transparent to infrared radiation on the encapsulating thin film that defines an aperture over the absorber structure.

15. The method of claim 1, wherein the substrate comprises a CMOS substrate.

16. The method of claim 15, wherein the CMOS substrate includes an etch stop layer, and wherein the first sacrificial layer is deposited on top of the etch stop layer.

* * * * *